United States Patent [19]

Watanabe et al.

[11] Patent Number: 5,091,285
[45] Date of Patent: Feb. 25, 1992

[54] METHOD OF FORMING PATTERN BY USING AN ELECTROCONDUCTIVE COMPOSITION

[75] Inventors: Keiji Watanabe, Atsugi; Yasuhiro Yoneda, Tokyo; Koichi Kobayashi, Yokohama; Keiko Yano, Kawasaki; Tomio Nakamura, Ichikawa; Shigeru Shimizu, Yokohama, all of Japan

[73] Assignees: Fujitsu Limited, Kawasaki; Nitto Chemical Industry Co., Ltd., Tokyo, both of Japan

[21] Appl. No.: 515,444

[22] Filed: Apr. 27, 1990

[30] Foreign Application Priority Data

Apr. 28, 1989 [JP] Japan .................. 1-107800

[51] Int. Cl.$^5$ ............................................. G03F 7/004
[52] U.S. Cl. .................................. 430/296; 430/330; 430/942
[58] Field of Search .............. 430/49, 54, 191, 296, 430/942, 330

[56] References Cited

FOREIGN PATENT DOCUMENTS 55-142050  11/1980  Japan .
58-34841   3/1983   Japan .
62-27258   11/1987  Japan .................. 430/296
1-236273   9/1989   Japan .

Primary Examiner—Charles L. Bowers, Jr.
Assistant Examiner—Janet C. Baxter
Attorney, Agent, or Firm—Staas & Halsey

[57] ABSTRACT

A pattern-forming method using an electroconductive composition comprising at least one TCNQ complex salt selected from the group consisting of isoquinolinium-TCNQ complex salts, quinolinium-TCNQ complex salts, alkyl pyridinium-TCNQ complex salts, and morpholinium-TCNQ complex salts, a specific polymer, and a solvent are disclosed. This composition gives an electroconductive film having a superior long-term storage stability and electroconductive characteristics.

When this electroconductive composition is coated on a resist to form an electroconductive film, and a pattern is formed by an irradiation with charging beams, such as electron beams, an accumulation of charges (charge-up) is prevented and a fine resist pattern in which a misregistration is completely prevented is obtained.

11 Claims, 6 Drawing Sheets

METHOD OF FORMING PATTERN BY USING AN ELECTROCONDUCTIVE COMPOSITION

BACKGROUND OF THE INVENTION

1. Field of the Invention

The present invention relates to a method of forming a pattern by using an electroconductive composition. More particularly, the present invention concerns a method of forming a fine resist pattern by using an electroconductive composition having a property such that an accumulation of charges is avoided when a resist pattern is formed.

2. Description of the Related Art

The thin film-forming technique and the photographic etching technique are widely used for the formation of electronic circuit elements having a fine pattern, such as semiconductor elements. More specifically, thin films layers such as an electroconductive layer and an insulating layer are formed on a substrate by the sputtering method, the chemical vapor phase growth method or the like, and then a resist (photosensitive resin) is coated by the spin-coating method or the like and exposed to light, and by utilizing the difference of the solubility of the resist in a liquid developer in the exposed area and in the unexposed area, a pattern is formed. Then, using the formed resist pattern as a mask, a wet etching or dry etching is carried out to form a fine conductor pattern or insulating layer pattern on the substrate.

As the light source for the exposure of the resist, ultraviolet rays, excimer laser beams, X-rays, electron beams, and focusing ion beams are used. The lithography process using electron beams, among these light sources, is widely utilized for the production of masks, the trial production of logic circuits, and the production of minute-quantity multiple-grade type LSI's such as ASIC, the need for which has recently increased, because patterning can be directly performed without using a mask. Focusing ion beams, by which a direct patterning is possible, show a good straight-advance property and a superior, because little scattering occurs in the resist. Accordingly, the application of focusing ion beams to the production of fine devices, for which a fine processing is required, is under investigation.

Nevertheless, since resist materials for electrons or focusing ion beams are usually insulators, when the exposure is carried out by using electron beams or ion beams, an accumulation of charges, i.e., a charge-up, occurs, and a misregistration of the pattern is obtained. This misregistration of the pattern is increased as the pattern becomes finer, and the problem of the misregistration of the pattern becomes more serious with each increase of the degree of integration.

To prevent this charge-up, attempts have been made to coat aluminum or a treating agent such as an electroconductive polymer on a resist, but this method of preventing a charge-up by coating aluminum is defective in that the process steps are complicated. The method using a treating agent such as an electroconductive polymer is advantageous in that the steps are simple, but since a material showing a sufficient resistance to a charge-up has not been found, this method is not in use in practice.

SUMMARY OF THE INVENTION

A primary object of the present invention is to provide a method of forming a pattern by electron beam lithography, or focusing ion beam lithography, in which a charge-up by irradiation with charging beams is avoided and misregistration of the pattern is prevented.

Another object of the present invention is to provide a method of forming a fine pattern, in which the steps are simple and misregistration of the pattern is effectively prevented.

The present inventors carried out research with a view to attaining the foregoing objects, and as a result, found that a pattern-forming electroconductive composition described below will prevent a charge-up, and the present invention is based on this finding.

DESCRIPTION OF THE PREFERRED EMBODIMENTS

The method of pattern-forming by using an electroconductive composition of the present invention comprises the steps of: (1) forming a resist film on a substrate, (2) coating an electroconductive composition on the resist film to form an electroconductive film, (3) irradiating the coated substrate with charging beams for forming pattern by a exposure, and (4) developing the electroconductive film and resist film to form a resist pattern, wherein said electroconductive composition comprises (A) 0.05 to 30 parts by weight of at least one tetracyanoquinodimethane (TCNQ) complex salt selected from the group consisting of isoquinolinium TCNQ complex salts represented by the following formula (I):

wherein $R_1$ represents an alkyl group having 3 to 24 carbon atoms and m is a rational number of from 0 to 2, $(TCNQ)^+$ represents an anion-radical of TCNQ, and (TCNQ) represents a neutral TCNQ, quinolinium TCNQ complex salts represented by the following formula (II):

(II)

wherein $R_2$ represents an alkyl group having 3 to 24 carbon atoms and m is a rational number of from 0 to 2, alkyl pyridinium TCNQ complex salts represented by the following formula (III):

(III)

wherein $R_3$ represents an alkyl group having 3 to 24 carbon atoms, $R_4$ represents an alkyl group having 1 to 6 carbon atoms, and m is a rational number of from 0 to 2, and morpholinium TCNQ complex salts represented by the following formula (IV):

(IV)

wherein $R_5$ represents an alkyl group having 3 to 24 carbon atoms, $R_6$ represents hydrogen or an alkyl group having 1 to 6 carbon atoms, and m is a rational number of from 0 to 2, (B) 0.05 to 100 parts by weight of a polymer comprising 50 to 100% by weight of units of a monomer represented by the following formula:

wherein R represents a hydrogen atom or a methyl group and R' represents an alkyl group having 1 to 6 carbon atoms, and 0 to 50% by weight of units of at least one monoethylenically unsaturated monomer, and (C) 100 parts by weight of a solvent.

The component (A) of the composition used in the present invention is used in an amount of 0.05 to 30 parts by weight, preferably 0.1 to 5.0 parts by weight, per 100 parts by weight of the solvent. If the amount of the component (A) is smaller than 0.05 part by weight, the electroconductivity is poor, and if the amount of the component (A) is larger than 30 parts by weight, the solubility and film forming properties (such as the lubricating property) become poor and a further improvement of the electroconductivity cannot be obtained.

In the present invention, TCNQ complex salts are used as the component (A). More specifically, an N-octylisoquinolinium-TCNQ complex salt corresponding to the formula (I), an N-hexylquinolinium-TCNQ complex salt corresponding to the formula (II), an N-butyl-α-picolinium-TCNQ complex salt corresponding to the formula (III) and an N-methyl-N-butylmorpholinium-TCNQ complex salt corresponding to the formula (IV) are advantageously used as the component (A).

These complex salts can be used alone, or in the form of a mixture of two or more thereof, as the component (A). If a mixture comprising at least two TCNQ complex salts is used, the electroconductivity, and the heat resistance of the formed thin film are greatly improved. This is because if complex salts having different crystal forms are used in combination, the contact points in the TCNQ complex salts become more intimate and the electroconductivity and heat resistance are improved compared to those attained when a single complex salt is used. Accordingly, in the present invention, a mixture of two or three of the foregoing TCNQ complex salts is preferably used as the component (A). The sheet resistivity of the electroconductive film of the present invention is in the order of $10^7$ Ω/□ for single complex salt system, and $10^6$ Ω/sheet for a mixture complex salts system. As preferred examples of the TCNQ complex salt mixture, there can be mentioned a mixture of an N-butylisoquinolinium-TCNQ complex salt and an N-octylisoquinolinium-TCNQ complex salt, a mixture of an N-butylisoquinolinium-TCNQ complex salt and an N-butyl-α-picolinium-TCNQ complex salt, a mixture of an N-buthylisoquinolinium-TCNQ complex salt and an N-methyl-N-butylmorpholinium-TCNQ complex salt, and a mixture of an N-butylisoquinolinium-TCNQ complex salt, an N-butyl-α-picolinium-TCNQ complex salt, and an N-methyl-N-butylmorpholinium-TCNQ complex salt.

The component (B) of the composition used in the present invention is a homopolymer or a copolymer. More specifically, as the polymer having a good film-forming property, there can be mentioned polymethyl methacrylate, a methyl methacrylate/ethyl acrylate copolymer, a methyl methacrylate/butylacrylate copolymer, a methyl methacrylate/butyl methacrylate copolymer, and a methyl methacrylate/styrene copolymer.

The polymer as the component (B) is used in an amount of 0.05 to 100 parts by weight, preferably 0.5 to 50 parts by weight, per 100 parts by weight of the solvent. If the amount of the component (B) is smaller than 0.05 part by weight, pinholes are formed in the film, and if the amount of the component (B) is larger than 100 parts by weight, the thickness becomes too large and a desired thickness cannot be obtained.

In the composition of the present invention, in view of the property of dissolving the polymer and TCNQ complex salt, and of the vapor pressure, ketone type and ether type organic solvents are used as the solvent as the component (C). For example, at least one member selected from the group consisting of cyclohexanone, methylisobutylketone, methylcellosolve, and methylcellosolve acetate is used.

The solvent is purified so that the water content is lower than 0.1%, preferably lower than 500 ppm, most preferably lower than 200 ppm. Cyclohexanone is used after purification so that the content of cyclohexanone derivatives such as and the like is lower than 0.1%, preferably lower than 500 ppm, most preferably lower than 100 ppm.

Customary methods such as distillation and membrane separation can be adopted for the purification, but the use of the purified solvent is preferred because a storage stability of the electroconductive composition over a long period can be attained and the effect of preventing misregistration of the pattern is enhanced.

Furthermore, a surface active agent can be added to the electroconductive composition, to improve the film-forming property, and a stabilizer can be added to further improve the stability of the electroconductive composition.

A nonionic surface active agent is preferably used as the surface active agent, and an ortho-formic acid ester and an acetal can be used as the stabilizer. The surface active agent is used in an amount of up to 0.5 part by weight and the stabilizer is used in an amount of up to 10 parts by weight, per 100 parts by weight of the solvent.

The inventors found that, if a pattern-forming method comprising the following steps (1) through (4) is adopted, a charge-up is prevented and a good pattern can be obtained without misregistration, and the present invention is based on this finding.

More specifically, according to the present invention, there is provided a pattern-forming method comprising (1) the step of forming a resist film on a substrate, (2) the step of coating an electroconductive composition as described above on the resist film to form an electroconductive film, (3) the step of irradiating the coated substrate with charging beams such as electron beams for forming pattern by an exposure, and (4) the step of developing the electroconductive film and resist film to form a resist pattern.

A silicon semiconductor substrate and a gallium-arsenic substrate are used as the substrate in the method of the present invention. The resistivity of the GaAs substrate $10^7$ Ωcm is higher on the order of $10^{2-4}$ than, that of Si substrate of the overall resistivity, i.e., containing insulation layer such as $SiO_2$ film, so, the problem of the misregistration of the pattern by charging up becomes more serious. An electron beam resist (EB resist) and an ion beam resist are used as the resist. Either a positive resist or a negative resist can be used as the EB resist, and for example, polymethyl methacrylate, crosslinked polymethyl methacrylate and polyacrylamide are preferably used.

The formation of the resist film at step (1) is accomplished, for example, by spin-coating the resist on the substrate and prebaking the resist.

The formation of the electroconductive film at step (2) is accomplished, for example, by spin-coating the electroconductive composition on the resist film formed at step (1) and prebaking the composition. The thickness of the electroconductive film can be adjusted by changing the rotation number at the spin-coating step. To obtain a film having a thickness of 0.1 to 1.0 μm and a good smoothness, preferably the rotation number is adjusted to 1,000 to 5,000 rpm. The preferable thickness range of the electroconductive film for pattern forming method by using charging beams may be 0.2–0.3 μm or less, if a satisfactory electroconductivity can be obtained, as if the thickness of the electroconductive film is too thick, the resolution becomes poor.

Irradiation with electron beams (EB) is popular as the irradiation with charging beams at the step (3), but other irradiation, for example, irradiation with ion beams, can be adopted.

At step (4), the electroconductive film and the resist film are simultaneously removed by development using a liquid developer, for example, a methylisobutylketone/isopropanol liquid mixture.

In the pattern-forming method of the present invention utilizing electron beam lithography or focusing ion lithography by coating the electroconductive composition on the resist film, an electroconductive film is formed, and in the light exposure by irradiation with electron beams or ion beams, charges generated in the resist are not accumulated at one point in the resist but dispersed in the resist. Accordingly, mutual actions of charges at the subsequent exposure do not occur and a misregistration of the pattern is effectively prevented. Furthermore, the electroconductive film can be formed by spin-coating and the electroconductive film is removed simultaneously with the resist film by the development, and therefore, the process steps are effectively simplified.

The present invention will now be described in detail with reference to the following examples and comparative examples.

EXAMPLE 1

An N-octylisoquinolinium-TCNQ complex salt was synthesized according to the known method [J. Am. Chem. Soc. Vol. 84, page 3374–3387 (1962)]. The compound showed the following absorptions characteristic of the TCNQ complex salt: IR spectrum, 2800 cm$^{-1}$ (br); charge-transfer spectrum, 2150 cm$^{-1}$; absorption of CN ( group of complex salt, and ultraviolet spectrum, λmax 395 nm (TCNQ), 842 nm (TCNQ'). This compound is represented by the formula (I) in which m is 1.2.

Then 0.75 part by weight of the obtained complex salt and 5 parts by weight of a methyl methacrylate/butyl acrylate copolymer ($\overline{Mw}$=about 70,000) were dissolved in 100 parts by weight of a cyclohexanone/methylcellosolve mixed solvent (weight ratio=7/3), and a fluorinated alkyl ester (FC-431 supplied by Minesota Mining Mfg. & Co.) was added as the surface active agent so that the concentration was 100 ppm based on the solvent, whereby a pattern-forming electroconductive composition was prepared. The thickness of the film coated by spin-coating the composition at a speed of 2500 rpm is 0.2 to 0.3 μm.

Using the obtained electroconductive composition, a pattern was formed according to the following procedures.

A CMR posi-type resist (T. Kitakoji, Y. Yoneda, and K. Kitamura J. Electrochem. Soc. Vol. 126, No. 11, p. 1181 (1979))was coated in a thickness of 2.0 μm on a Si substrate by the spin-coating method, and the resist was prebaked at 180° C. for 100 seconds on a hot plate, and thereafter, the electroconductive composition was coated on the resist in a thickness of 0.2 μm and baked at 70° C. for 100 seconds on a hot plate. Then, an exposure to electron beams was carried out at an acceleration voltage of 30 kV and an electron beam exposure quantity of 50 μC/cm$^2$, and a development was carried out with a methylisobutylketone/isopropanol mixed solvent (MIBK/IPA=1/1) by using a spin developer, followed by a rinsing treatment with IPA. By this development, the electroconductive composition was removed together with the resist, and post baking was carried out at 110° C. for 100 seconds.

Figure 1:
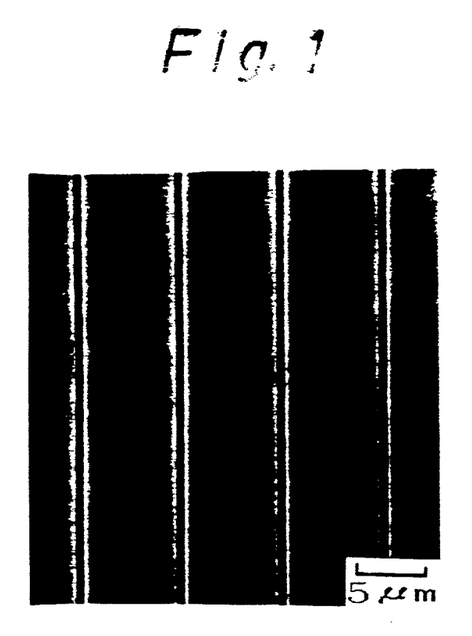
FIG. 1 is an electron microscope photo (2500 magnifications) of a pattern formed by the pattern-forming method of the present invention by coating an electroconductive composition.

The scanning electron microscope (SEM) photo (2,500 magnifications) of the thus obtained pattern is shown in FIG. 1. As seen from FIG. 1, there is no misregistrain of the pattern at the connection portion in the shot, and the resolution was not adversely influenced. Furthermore, the pattern of line (3 μm) and space (0.4 μm) is clearly resolved.

The prevention of charge-up was evaluated by following method.

Figure 5:
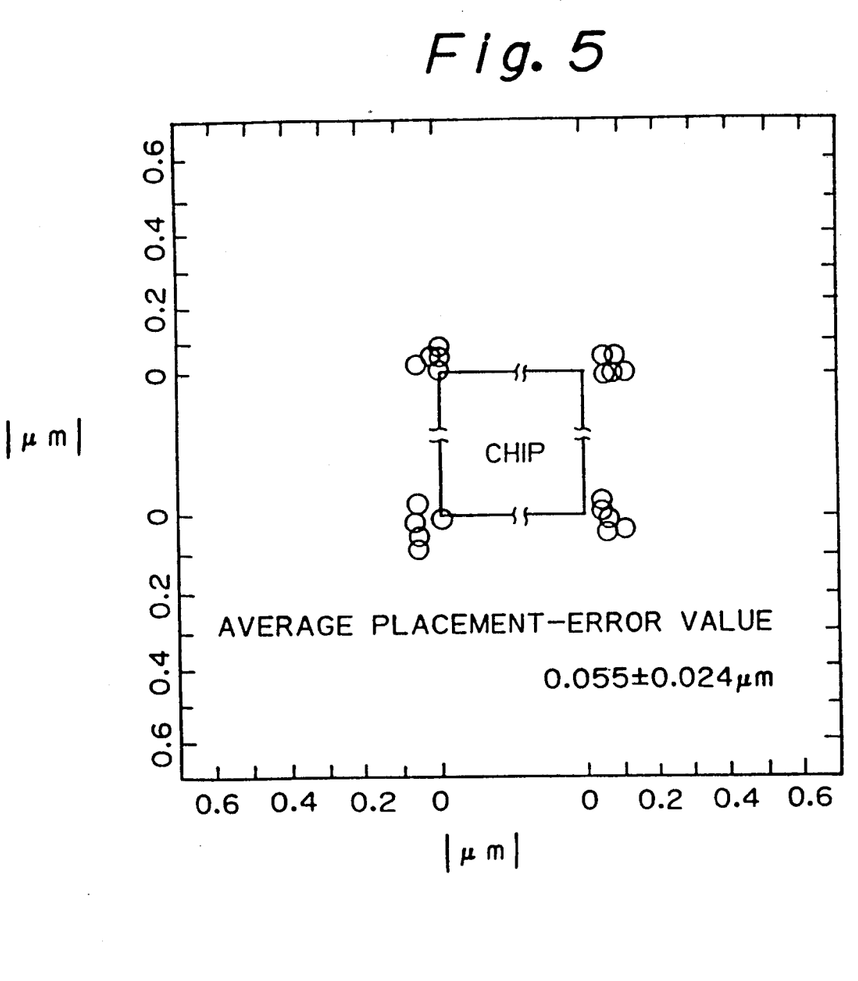
FIG. 5 is a graph showing data of charge-up evaluation of the sample coated with a electroconductive film.

A CMR posi-type resist was coated in a thickness of 2.0 μm on an Al-Si substrate wafer having many chip areas and each chip 9.5×9.5 mm$^2$ having alignment step marks on each four corners, and the resist was baked at 180° C. for 100 seconds on a hot plate. Then the electroconductive composition was coated in a thickness of 0.2 μm on the resist and baked at 70° C. for 100 seconds on a hot plate (FIG. 4(1)). Thereafter, alignment marks present on four corners of a chip on the wafer were detected by an electron beam exposure apparatus (FIG. 4(2)), about 20% of the area was exposed by electron beams at an acceleration voltage of 30 kV and an electron beam exposure quantity of 50 μC/cm$^2$ (FIG. 4(3)), and the marks at the four corners were again detected (FIG. 4(4)). The detected values were compared with the values detected before the exposure, the detection was carried out on five chips of each wafer, and no misregistration was observed, as shown in FIG. 5.

COMPARATIVE EXAMPLE 1

Figure 2:
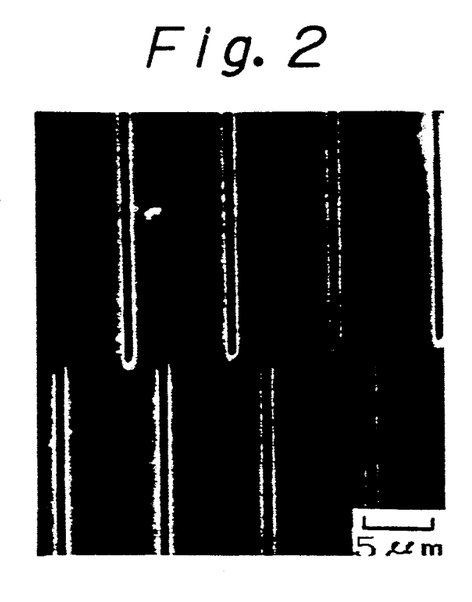
FIG. 2 is an electron microscope photo (2500 magnifications) of a pattern formed by the conventional pattern-forming method not using an electroconductive composition.

A CMR resist was coated to a thickness of 2.0 μm on a Si substrate by the spin-coating method and prebaked at 180° C. for 100 seconds on a hot plate. Then an electron beam exposure was carried out at an acceleration voltage of 30 kV and an electron beam exposure quantity of 50 μC/cm$^2$, and a development was carried out with an MIBK/IPA mixed solvent (1/1), followed by a rinsing treatment with IPA. Post baking was carried out at 110° C. for 100 seconds, and the formed pattern was observed by SEM. It was found that a misregistration of the pattern at the connection portion in the shot had occurred, as seen from the photo (2,500 magnifications) of FIG. 2 (line: 3 μm, space: 0.4 μm).

Figure 6:
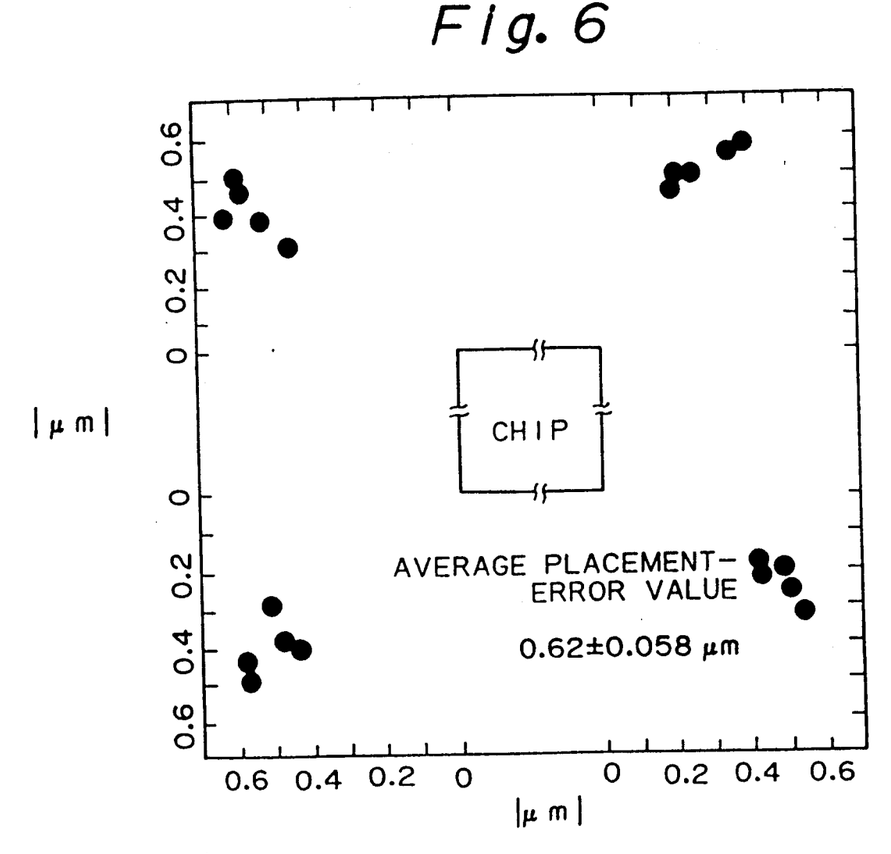
FIG. 6 is a graph showing data of charge-up evaluation of a sample not coated with a electroconductive film.

Furthermore, a misregistration of 0.6 μm was observed in comparison with the values detected of the marks before exposure and those of the marks after exposure for the sample used in this example, by using same method as that in Example 1. The results are shown in FIG. 6.

Figure 7:
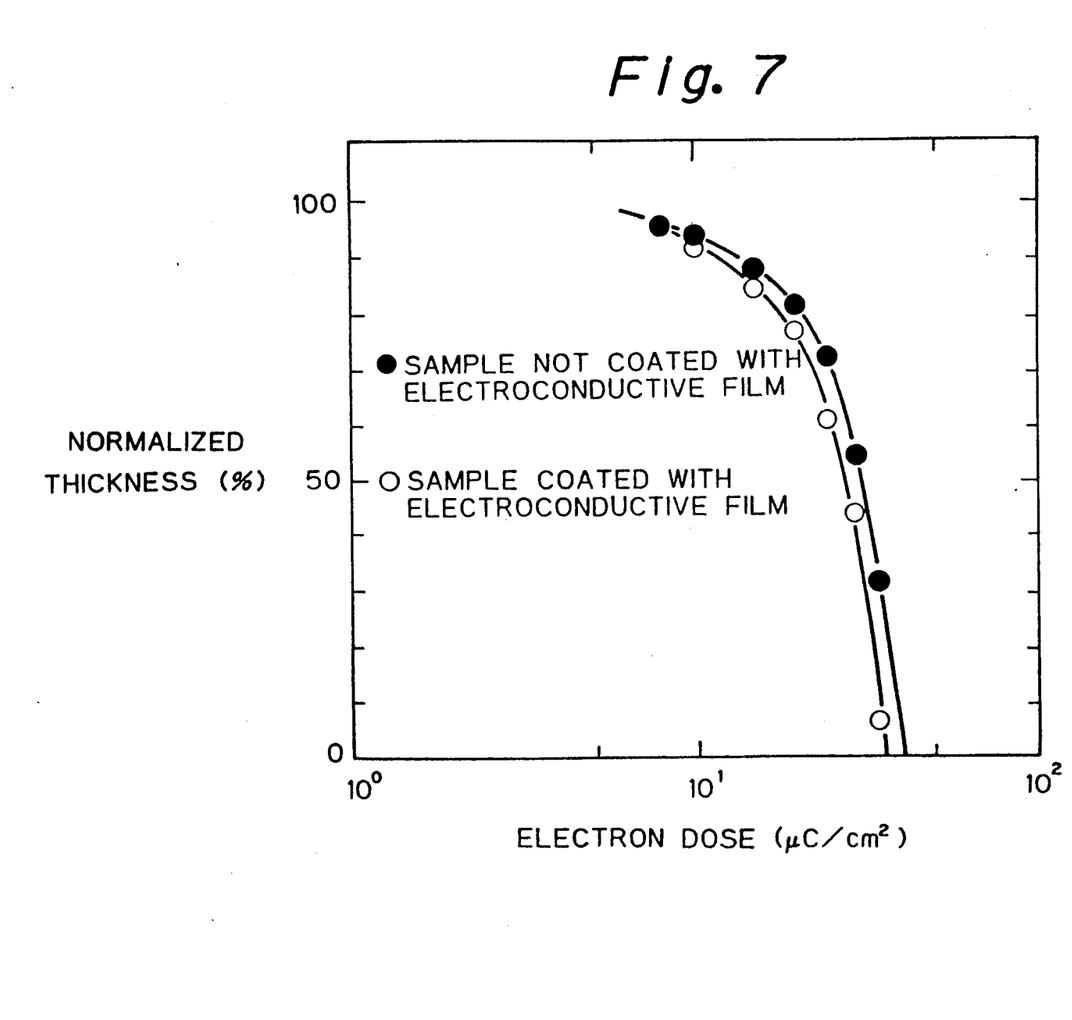
FIG. 7 shown data of changes in sensitivity curves of a CMR resist when coated with an electroconductive film.

Furthermore, the sensitivity curves for the CMR resist where the conductive film in the present invention is used and for the CMR resist where the conductive film is not used are shown in FIG. 7. As shown in FIG. 7, there is little difference in the sensitivity in either case.

EXAMPLE 2

An N-hexylquinolinium-TCNQ complex salt was synthesized according to the known method [J. Am. Chem. Soc., 84, 3374–3387 (1962)]. The obtained compound showed absorptions characteristic of the TCNQ complex salt in the IR spectrum [2800 cm$^{-1}$ (br), 2150 cm$^{-1}$] and the ultraviolet spectrum [λmax 395 nm (TNCQ), 842 nm (TCNQ$^+$)]. The compound is represented by the formula (II) in which m is 1.1.

An electroconductive composition was prepared by using the obtained complex salt in the same manner as described in Example 1.

A resist pattern was prepared by using the obtained electroconductive composition in the same manner as described in Example 1.

With respect to the obtained resist pattern, the charge-up prevention was examined in the same manner as described in Example 1, and it was found that a misregistration of the pattern was completely prevented, and that the sensitivity and resolution of the resist were not adversely influenced by the use of the electroconductive composition of this example.

COMPARATIVE EXAMPLE 2

When the procedures of Example 1 were repeated, except that a polycarbonate was used instead of the methyl methacrylate/butyl acrylate copolymer as the polymer was mixed with the N-octylisoquinolinium-TCNQ complex salt, whitening occurred at the spin-coating step and a film was not formed. When polyvinyl carbazole was similarly used, if the thickness was larger than 0.1 μm, cracking occurred at the baking step. When poly(4-vinyl-pyridine) was used, a film could be formed but substantially no misregistration-preventing effect was observed.

EXAMPLE 3

An electroconductive composition was prepared and a resist pattern was formed in the same manner as described in Example 1, except that methylisobutylketone was used instead of the cyclohexanone/methylcellosolve mixed solvent. Note, the additive, acetonedimethylacetal was added at the ratio of 1000 ppm based on the solvent, and also the concentration of the above composition was prepared such that the thickness of the film was between 0.2 μm and 0.3 μm when spun-coated at 2500 rpm.

When the quantity of misregistration was examined in the same manner as described in Example 1, it was found that misregistration was completely prevented.

The electroconductive composition was removed together with the resist, at the development, and it was found that the sensitivity and resolution of the resist were not adversely influenced by the use of the electroconductive composition of this example.

EXAMPLE 4

An electroconductive composition was prepared and a resist pattern was formed in the same manner as described in Example 1, except that purified cyclohexanone alone was used instead of the mixed solvent used in Example 1. Namely, cyclohexanone was purified by distillation and the obtained fraction having a boiling point of 155° to 156.5° C., in which the water content was 150 ppm or less and the content of cyclohexanone derivatives (high-boiling point fractions) such as and the like was 60 ppm or less was used as the solvent.

The obtained electroconductive composition was stored at 5° C. for 6 months, and in the same manner as described in Example 1, a resist pattern was formed and the quantity of misregistration measured. It was found that no misregistration of the pattern had occurred.

Separately, an electroconductive composition was similarly prepared by using unpurified cyclohexanone not subjected to the distillation, and the electroconductive composition was stored at 5° C. for one month. Then a resist pattern was formed and the quantity of misregistration was measured. No misregistration was found.

Note, the stability of the electroconductive composition was improved when a methylcellosolve is refined.

EXAMPLE 5 (USE OF COMPLEX SALT MIXTURE)

An electroconductive composition was prepared in the same manner as described in Example 1, except that a mixture comprising an N-octylisoquinolinium-TCNQ complex salt (m=0.9) and an N-butylisoquinolinium-TCNQ complex salt (m=1.1) at a weight ratio of 7/3 was used instead of the N-octylisoquinolinium-TCNQ complex salt used in Example 1. A methylmethacrylate/ethylacrylate copolymer was used as the polymer. By using the obtained electroconductive composition, a resist pattern was formed in the same manner as described in Example 1.

No influence on the sensitivity and the resolution of the conductive film of this example was observed.

The charge-up prevention of the electroconductive composition was evaluated according to the following procedures.

A CMR resist (crosslinked polymethyl methacrylate resist) was coated in a thickness of 2.5 μm on a Si substrate wafer having alignment step marks and the resist was baked at 180° C. for 100 seconds on a hot plate. Then the electroconductive composition was coated on the resist and baked at 70° C. for 100 seconds on a hot plate. Thereafter, alignment marks present on four corners of each chip on the wafer were detected by an electron beam exposure apparatus, and about 40% of the area was light-exposed at an acceleration voltage of 30 kV and an electron beam exposure quantity of 50 μC/cm$^2$, and the marks at the four corners were again detected. The detected values were compared with the values detected before the exposure, and it was found that the quantity of misregistration was 1.2 μm when the CMR resist alone was coated. In contrast, when the electroconductive composition was further coated, miregistration was completely prevented.

EXAMPLE 6 (USE OF COMPLEX SALT MIXTURE)

An electroconductive composition was prepared in the same manner as described in Example 5 except that a mixture comprising an N-octylisoquinolinium-TCNQ complex salt (m=0.9) and an N-butyl-N-methylmorpholinium-TCNQ complex salt (m=0.9) at a weight ratio of 5/5 was used instead of the complex salt mixture used in Example 1. A methylmethacrylate/stylene copolymer ($\overline{Ww}=6\times10^4$) was used as the polymer. Using the obtained electroconductive composition, a resist pattern was formed in the same manner as described in Example 1.

The formed resist pattern was evaluated in the same manner as described in Example 1, and it was found that a misregistration of the pattern was completely prevented, and that the sensitivity and resolution of the resist were not adversely influenced by the use of the electroconductive composition of this example. When the quantity of misregistration was examined in the same manner as described in Example 5, it was found that misregistration was completely prevented.

EXAMPLE 7 (USE OF COMPLEX SALT MIXTURE)

An electroconductive composition was prepared in the same manner as described in Example 1 except that a mixture comprising an N-butyl-isoquinolinium-TCNQ complex salt (m=0.9), an N-butyl-α-picolinium-TCNQ complex salt (m=0.9) and an N-butyl-N-methylmorpholinium-TCNQ complex salt (m=0.9) at a weight ratio of 4/5/1 was used instead of the complex salt mixture used in Example 1 and cyclohexanone solvent was used instead of cyclohexanone/methylcellosolve mixed solvent. Using the obtained electroconductive composition, a resist pattern was formed in the same manner as described in Example 1 except that, after the coating of the electroconductive composition, baking was carried out at 120° C. for 100 seconds on a hot plate.

The formed resist pattern was evaluated in the same manner as described in Example 1, and it was found that misregistration of the pattern was completely prevented, and that the sensitivity and resolution of the resist were not adversely influenced by the use of the electroconductive composition of this example. When the quantity of misregistration was examined in the same manner as described in Example 5, it was found that misregistration was completely prevented. Furthermore, it was found that the heat resistance of the film was improved, and is advantageous in the lithograpahy process.

EXAMPLE 8

Electroconductive compositions were prepared in the same manner as described in Example 5 except that the N-octylisoquinolinium-TCNQ complex salt and N-butylisoquinolinium-TCNQ used in Example 5 were independently used. Using the obtained electroconductive compositions, resist patterns were formed in the same manner as described in Example 1, and misregistration of the pattern was measured with respect to each electroconductive composition. With respect to each electroconductive composition, a misregistration-preventing effect was observed at a resist film thickness of 2.0 μm and an exposure area of up to about 30% in the chip. When the resist film thickness was 2.5 μm and the exposure area was 40%, about 0.2 μm of misregistration occurred, but in view of the fact that the misregistration quantity was 1.2 μm when CMR alone was used, it was confirmed that a misregistration-reducing effect was attained by the use of the above-mentioned TCNQ complex salts alone.

EXAMPLE 9 AND COMPARATIVE EXAMPLE 3

The electroconductive composition obtained in Example 1 was stored for a predetermined time after the preparation, and misregistration of the resist pattern was examined. Namely, the composition was stored in a clean room maintained at a temperature of 23° C.±2° C. and a relative humidity of 40%±5%.

Figure 3:
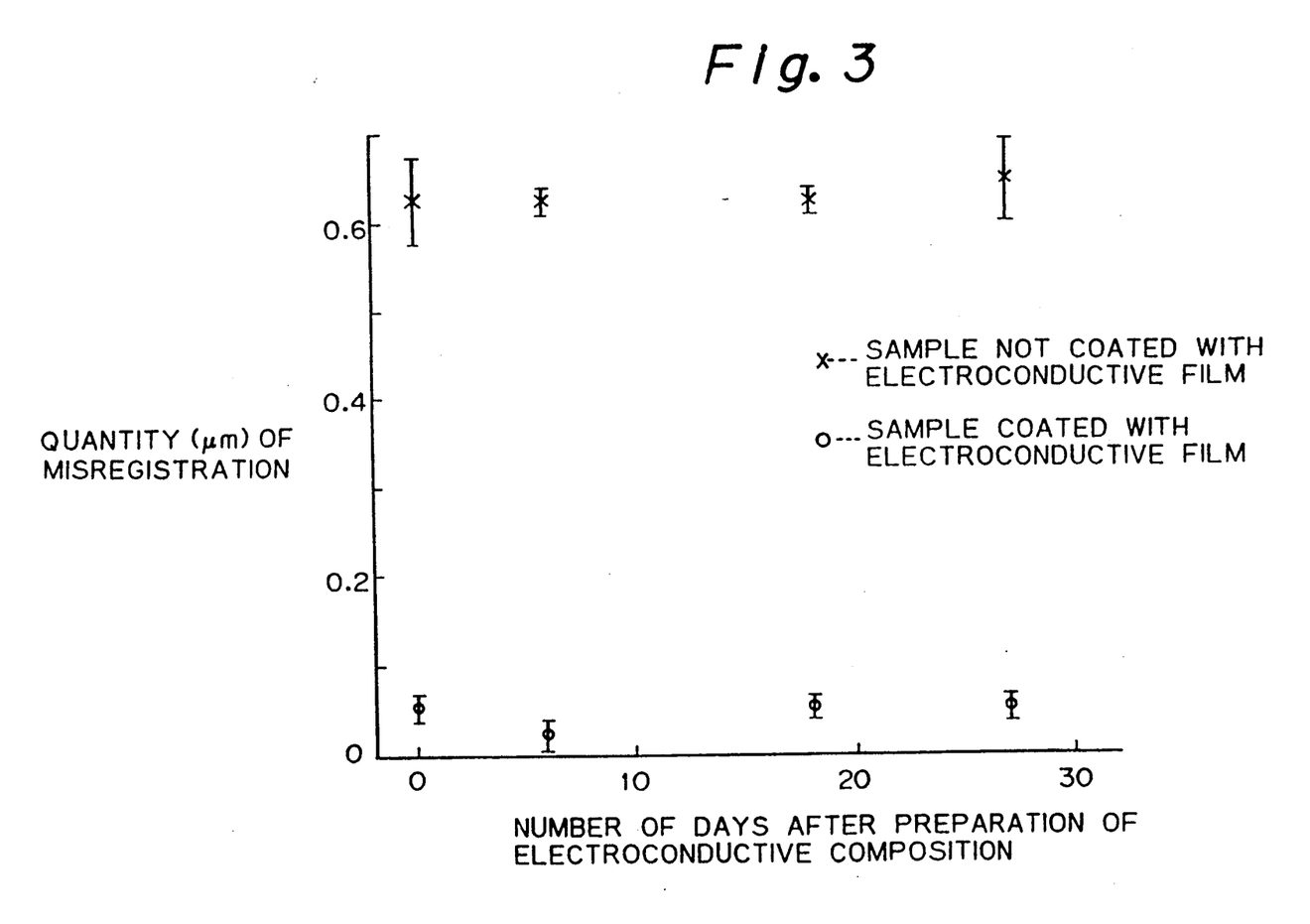
FIG. 3 is a graph illustrating the relationship between the quantity of misregistration of a pattern in a sample formed by or without coating the electroconductive composition of the present invention and the number of days after the preparation of the electroconductive composition.
Figure 4:
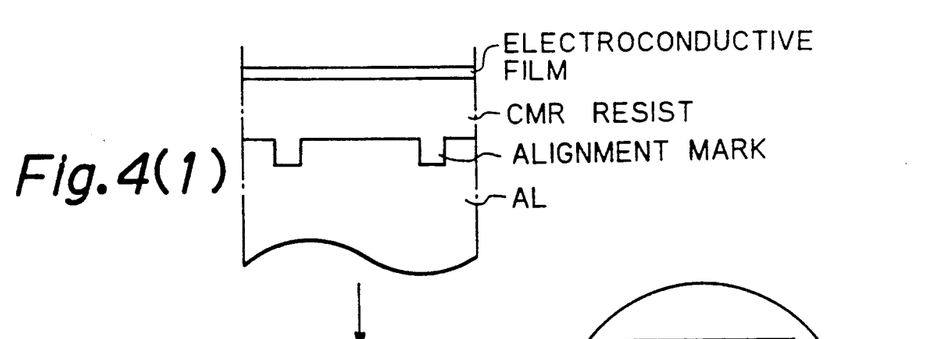
FIG. 4 is a flow sheet showing a procedure of the charge-up evaluation.

The obtained data of the storage stability are shown in FIG. 3. Note, a misregistration of the resist (CMR) pattern formed without coating the electroconductive composition is indicated by a mark "X" in FIG. 3.

As apparent from the graph of FIG. 3, the composition of the present invention has a superior storage stability.

As apparent from the foregoing description, in the present invention, since an electroconductive composition is formed by incorporating a predetermined TCNQ complex salt into a predetermined polymer, and a solvent and a pattern is formed by using this composition, a charge-up can be satisfactorily prevented by the formed electroconductive film, and an effect of completely preventing a misregistration of the pattern can be attained.

When one TCNQ complex salt is used alone, the resulting electroconductive composition can be stored for a long time (at least one month at room temperature), and the electroconductive composition is advantageous for formation of a pattern. Furthermore, if an electroconductive composition comprising a TCNQ complex salt mixture is used, a high heat resistance and the effect of preventing the misregistration are superior to those when the TCNQ complex salt is used alone, due to the high conductivity.

Moreover, since the electroconductive composition of the present invention has a good dispersibility, a thin and uniform electroconductive film can be formed. This feature is especially significant in the case of an electron beam exposure.

We claim:

1. A pattern-forming method comprising the steps of: (1) forming a resist film on a substrate, (2) coating an electroconductive composition on the resist film to form an electroconductive film (3) irradiating the coated substrate with electron beams or ion beams for forming a pattern by exposure, and (4) developing the electroconductive film and resist film to form a resist pattern using a liquid developer to simultaneously remove the electroconductive film and the resist film, wherein said electroconductive composition comprises (A) 0.05 to 30 parts by weight of at least one tetracyanoquinodimethane (TCNQ) complex salt selected from the group consisting of isoquinolinium TCNQ complex salts represented by the following formula (I):

wherein $R_1$ represents an alkyl group having 3 to 24 carbon atoms, $(TCNQ)^+$ represents a negatively charged TCNQ radical, $(TCNQ)^\circ$ represents a neutral TCNQ radical, and m is a rational number of from 0 to 2, quinolinium TCNQ complex salts represented by the following formula (II):

wherein $R_2$ represents an alkyl group having 3 to 24 carbon atoms, $(TCNQ)^+$ represents a negatively charged TCNQ radical, $(TCNQ)^\circ$ represents a neutral TCNQ radical, and m is a rational number of from 0 to 2, alkyl pyridinium TCNQ complex salts represented by the following formula (III):

wherein $R_3$ represents an alkyl group having 3 to 24 carbon atoms, $R_4$ represents an alkyl group having 1 to 6 carbon atoms, $(TCNQ)^+$ represents a negatively charged TCNQ radical, $(TCNQ)^\circ$ represents a neutral TCNQ radical, and m is a rational number of from 0 to 2, and morpholinium TCNQ complex salts represented by the following formula (IV):

wherein $R_5$ represents an alkyl group having 3 to 24 carbon atoms, $R_6$ represents hydrogen or an alkyl group having 1 to 6 carbon atoms, $(TCNQ)^+$ represents a negatively charged TCNQ radical, $TCNQ)^\circ$ represents a neutral TCNQ radical, and m is a rational number of from 0 to 2, (B) 0.05 to 100 parts by weight of a polymer comprising 50 to 100% by weight of units of a monomer represented by the following formula:

wherein R represents a hydrogen atom or a methyl group and R' represents an alkyl group having 1 to 6 carbon atoms, and 0 to 50% by weight of units of at least one monoethylenically unsaturated monomer, and (c) 100 parts by weight of a solvent.

2. A pattern-forming method according to claim 1, wherein any two TCNQ complex salts selected from the group of formulas I, II, III and IV are employed as an ingredient (A) in the electroconductive composition.

3. A pattern-forming method according to claim 1, wherein any three TCNQ complex salts selected from the group of formulas I, II, III and IV are employed as an ingredient (A) in the electroconductive composition.

4. A pattern-forming method according to claim 1, wherein the mixture of N-buthylisoquinolinium-TCNQ complex salt and N-octylisoquinolinium-TCNQ complex salt is employed as an ingredient (A) in the electroconductive composition.

5. A pattern-forming method according to claim 1, wherein the mixture of N-butylisoquinolinium-TCNQ complex salt and N-butyl-α-picolinium-TCNQ complex salt is employed as an ingredient (A) in the electroconductive composition.

6. A pattern-forming method according to claim 1, wherein the mixture of N-buthylisoquinolinium-TCNQ complex salt and N-methyl-N-buthylmorpholinium-TCNQ complex salt is employed as an ingredient (A) in the electroconductive composition.

7. A pattern-forming method according to claim 1, wherein the mixture of N-buthylisoquinolinium-TCNQ complex salt, N-buthyl-α-picolinium-TCNQ complex salt, and N-methyl-N-buthylmorpholinium-TCNQ complex salt is employed as an ingredient (A) in the electroconductive composition.

8. A pattern-forming method according to claim 1, wherein said electroconductive composition comprises (A) 0.75 part by weight of an N-octylisoquinolinium-TCNQ complex salt, (B) 5 parts by weight of a methyl methacrylate/butyl acrylate copolymer and (C) 100 parts by weight of a cyclohexanone/methylcellosolve mixed solvent.

9. A pattern-forming method according to claim 1, wherein said electroconductive composition comprises (A) 0.75 part by weight of a mixture comprising an N-octylisoquinolinium-TCNQ complex salt and an N-butyl-N-methylmorpholinium-TCNQ complex salt at a weight ratio of 5/5, (B) 5 parts by weight of a methyl methacrylate/styrene copolymer and (C) 100 parts by weight of a cyclohexanone/methylcollsolve mixed solvent.

10. A pattern-forming method according to claim 1, wherein said electroconductive composition comprises (A) 0.75 part by weight of a mixture comprising an N-butyl-isoquinolinium-TCNQ complex salt, an N-butyl-α-picolinium-TCNQ complex salt and an N-butyl-N-methylmorpholinium-TCNQ complex salt at a weight ratio of 4/5/1, (B) 5 parts by weight of a methyl methacrylate/butyl acrylate copolymer and (C) 100 parts by weight of a cyclohexanone/methylcellosolve mixed solvent.

11. A pattern-forming method according to claim 1, wherein post baking is carried out after the step (2).

* * * * *

UNITED STATES PATENT AND TRADEMARK OFFICE
CERTIFICATE OF CORRECTION

PATENT NO. : 5,091,285

DATED : February 25, 1992

INVENTOR(S) : KENJI WATANABE, YASUHIRO YONEDA, KOICHI KOBAYASHI, KEIKO YANO, TOMIO NAKAMURA and SHIGERU SHIMIZU.

It is certified that error appears in the above-identified patent and that said Letters Patent is hereby corrected as shown below:

Column 2, line 37, "shown" should be --shows--.

Column 7, line 17 and 18, "misregistrain" should be --misregistration--.

Signed and Sealed this

Twenty-second Day of June, 1993

Attest:

MICHAEL K. KIRK

Attesting Officer

Acting Commissioner of Patents and Trademarks